United States Patent
Lee et al.

(10) Patent No.: US 8,863,544 B2
(45) Date of Patent: Oct. 21, 2014

(54) SMALL-SIZE AND LIGHT-WEIGHT ENVIRONMENTAL CONTROL UNIT FOR AIRCRAFT-EXTERNAL STORES

(75) Inventors: Haeng-Bok Lee, Daejeon (KR); Daeyoon Jung, Daejeon (KR)

(73) Assignee: Agency for Defense Development, Daejeon (KR)

( * ) Notice: Subject to any disclaimer, the term of this patent is extended or adjusted under 35 U.S.C. 154(b) by 173 days.

(21) Appl. No.: 13/491,245

(22) Filed: Jun. 7, 2012

(65) Prior Publication Data
US 2013/0152615 A1 Jun. 20, 2013

(30) Foreign Application Priority Data
Dec. 16, 2011 (KR) .................. 10-2011-0136613

(51) Int. Cl.
*F25D 23/12* (2006.01)

(52) U.S. Cl.
USPC ............................. 62/259.2; 62/401; 62/426

(58) Field of Classification Search
CPC ... B60H 1/3208; F25B 9/004; F25B 2600/01; F25B 31/006
USPC .............. 62/241, 401, 426, 231, 238.4, 259.2
See application file for complete search history.

(56) References Cited

U.S. PATENT DOCUMENTS

| | | | | |
|---|---|---|---|---|
| 2,979,293 A * | 4/1961 | Mount | ...................... | 244/117 A |
| 3,047,210 A * | 7/1962 | Best | .................. | 415/27 |
| 3,082,609 A * | 3/1963 | Ryan et al. | ....................... | 62/89 |
| 3,097,504 A * | 7/1963 | Quick et al. | ..................... | 62/241 |
| 3,153,331 A * | 10/1964 | Rogers | ............................ | 62/241 |
| 3,259,176 A * | 7/1966 | Rice et al. | ...................... | 165/265 |
| 4,263,786 A * | 4/1981 | Eng | .................................. | 62/87 |
| 4,523,517 A * | 6/1985 | Cronin | .......................... | 454/74 |
| 4,813,632 A * | 3/1989 | Woodhouse | ................... | 244/95 |
| 4,963,174 A * | 10/1990 | Payne | ................................ | 62/87 |
| 5,386,823 A * | 2/1995 | Chen | ........................ | 128/204.15 |
| 5,507,150 A * | 4/1996 | Weber et al. | ................... | 62/100 |
| 5,899,085 A * | 5/1999 | Williams | ........................ | 62/236 |
| 6,948,331 B1 * | 9/2005 | Ho | ................................. | 62/401 |
| 8,019,522 B2 * | 9/2011 | Coons | .......................... | 701/100 |
| 2010/0084118 A1 * | 4/2010 | Murer et al. | ............. | 165/104.33 |
| 2011/0108239 A1 * | 5/2011 | Bruno et al. | ............. | 165/104.19 |

* cited by examiner

*Primary Examiner* — Mohammad M Ali
(74) *Attorney, Agent, or Firm* — Harness, Dickey & Pierce, P.L.C.

(57) ABSTRACT

An environmental control apparatus includes (A) a condensation air flow loop in which a fan driven when the aircraft is moved on the ground or flies performs a thermal exchange with a condenser of a cooling/heating flow loop; (B) the cooling/heating flow loop, including an evaporator, a compressor configured to have a rotating shaft coupled to the shaft of a ram air turbine, a condenser configured to perform a thermal exchange by the condensation air flow loop, and an expansion valve configured to expand the refrigerant condensed by the condenser, wherein the evaporator, the compressor, the condenser, and the expansion valve are interconnected by a refrigerant circulation line; (C) an air circulation loop for circulating and supplying cooled or heated air to a camera/electronic unit so that the camera/electronic unit maintains a constant temperature; and (D) a controller for controlling the driving of the elements in each of the loops.

10 Claims, 7 Drawing Sheets

SMALL-SIZE AND LIGHT-WEIGHT ENVIRONMENTAL CONTROL UNIT FOR AIRCRAFT-EXTERNAL STORES

CROSS-REFERENCE TO RELATED APPLICATION

This application claims the benefit of Korean Patent Application No. 10-2011-0136613 filed on Dec. 16, 2011, the entire disclosure of which is incorporated herein by reference.

BACKGROUND OF THE INVENTION

1. Field of the Invention

The present invention relates to an environmental control apparatus for aircraft and, more particularly, to a small-size and light-weight environmental control apparatus for aircraft-external stores. More particularly, the present invention relates to a small-size and light-weight environmental control apparatus for aircraft-external stores which is capable of properly maintaining temperature of the camera unit and the electronic unit of a high-resolution image information acquisition apparatus in an operating environment, such as high-speed movement or an abrupt change of an altitude in a high resolution image information acquisition process.

2. Background of the Related Art

Aircraft is equipped with an image information acquisition apparatus for obtaining an interest target image and transmitting the interest target image to the ground in real time.

The image information acquisition apparatus is equipped with a camera unit and an electronic unit and mounted on the pod of outside the body of the aircraft. The aircraft flies at a high speed at an altitude of about 14 km from a sea level and experiences a thermal load in the pod and an abrupt change of temperature due to the altitude. The change of an environment also affects the image information acquisition apparatus.

In other words, in order to obtain an image having the best quality while not deteriorating the image in a process of the electronic unit processing signals when the camera unit captures the image, there is a need for a temperature control function using thermal components, such as a device for securing cooling air or heating air from the environmental control apparatus, a cooling cycle system, a temperature sensor, a pressure sensor, an air circulation fan, and a heater so that high temperature due to generation of heat in the camera unit and the electronic unit can be cooled and temperature can remain within a specific range using a heating apparatus for a peripheral low temperature environment at a high altitude.

The environmental control apparatus is included in the aircraft in order to control the environment of the image information acquisition apparatus as described above. The environment control apparatus is placed in one section of the pod and is configured to control temperature so that a change of temperature according to a flying condition and an operating state can be minimized and the image information acquisition apparatus can obtain high-resolution image information.

The environmental control apparatus used for the image information acquisition apparatus of aircraft may be chiefly divided into an air cycle cooling apparatus and a steam cycle cooling apparatus.

The air cycle cooling apparatus adopts a method of supplying cooled air obtained by expanding air of high temperature and high pressure, extracted from the compressor of the main engine of the aircraft, into a turbine or a method using a reverse Brayton air cycle cooling apparatus for supplying air of low pressure and low temperature by expanding ram air, introduced into a ram air scoop by the flying speed of the aircraft, into the turbine. The steam cycle cooling apparatus typically obtains air of low temperature by using a change of the phase of a refrigerant in a similar way to a common air-conditioner.

The air cycle cooling apparatus is less sensitive to leakage on a cooling loop and it enables high efficiency cooling during high-speed flying, has a small size and light weight for supplied electric power, and facilitates maintenance and management because cooling and heating devices can be modulated. However, the air cycle cooling apparatus has low efficiency and requires addition electric power suitable for an aircraft speed condition in the ground, and may not obtain constant air temperature because cooling air temperature is greatly changed depending on a flying condition.

The steam cycle cooling apparatus has high efficiency, a low price, and a cooling ability as if it is flying irrespective of the speed of the aircraft even on the ground. However, the steam cycle cooling apparatus is relatively heavier for supply power than an air cycle and sensitive to leakage on the cooling loop, and it has limitations in terms of an operation in a high-speed flying environment and requires regular and consistent maintenance and management.

A condition that the air cycle cooling apparatus is installed and used in the pod includes a case where a high-speed flying condition of the speed of sound or higher or weight and a size are major design factors. A condition that the steam cycle cooling apparatus is used includes a case where cooling requirements, such as when aircraft flies even on the ground, are included, a case where supply power is limited, and a case where a low temperature cooling environment is necessary. When peripheral temperature is low temperature, an additional heating apparatus including a heater and a ventilation fan controls temperature of the image information acquisition apparatus by supplying heating air.

A conventional environmental control apparatus is shown in FIGS. 5 to 7.

FIG. 5 is a schematic diagram of a conventional air cycle cooling apparatus. An air cycle machine 190 for converting air of high temperature and high pressure into cooled air is indicated by a dotted line. Temperature of bleed air 120 that has been controlled by a main engine 100 and extracted by a bleed air controller 110 drops through a primary heat exchanger 130. The bleed air 120 is further compressed through the compressor 140 of the air cycle machine 190. Next, temperature of the bleed air 120 further drops through a secondary heat exchanger 150. The bleed air 120 becomes cooling air in a process in which the air is expanded through a turbine 160. At this time, the temperature of the bleed air is 20 degrees below zero to 70 degrees below zero, and the bleed air cannot be inputted to the pod to be directly cooled. Accordingly, the bleed air is mixed with air of high temperature the amount of supply of which is controlled depending on the degree of opening of a bypass valve 170 so that it becomes air 180 of proper temperature.

FIG. 6 shows a conventional reverse Brayton air cycle cooling apparatus. Air obtained by the flying speed of aircraft and inputted to a ram air inlet port is expanded by the turbine 200 of an air cycle machine, thereby obtaining air of low temperature. Next, the air of low temperature is supplied to a camera unit and an electronic unit via a heat exchanger 220 so that the air absorbs heat and is then externally discharged. In order to prevent the aircraft from overspeeding because the ram air of an excessive pressure is inputted to the air cycle machine when the aircraft flies at the speed of sound, a valve 210 is placed on the turbine inlet side so that the ram air is bypassed. A compressor 230 is driven by expansion motive power of the turbine 200, and the motive power generated from the turbine 200 is increased according to an increase in the rate of available expansion and in the temperature of supplied air. In case of the air cycle machine, however, the driving power of the compressor is small because the rate of available expansion and the supplied air temperature are in a low level. Accordingly, the compressor less contributes to cooling performance than the turbine does because the compressor does not have a high compression ratio.

FIG. 7 shows a conventional cooling cycle and heating system in which the air cycle cooling apparatus and the steam cycle cooling apparatus are mixed according to another example. The cooling and heating system includes a condenser air flow loop 326 using introduced ram air 325 in order to maintain internal temperature of the camera unit and the electronic unit 324 to some degree, a cooling cycle flow loop 327 for circulating a cooling cycle refrigerant, a heating system for raising temperature using a heater 336, and an air circulation loop 328.

The cooling and heating system chiefly includes a ram air scoop 329 (i.e., a ram air inlet port), a ram air turbine 330 for driving a compressor 332, a louver 331 for controlling the amount of air inflow, the compressor 332, an evaporator 333, an expansion valve 340, a ground fan 335, the heater 336, a condenser 339, and a fan 337 for ventilating air, outputted from the evaporator 333, to a camera unit and the electronic unit 324.

In a typical cooling cycle, the compressor, the evaporator, the condenser, and the expansion valve are sequentially connected together by a pipe filled with a refrigerant, thus forming a closed circuit.

An evaporation process is performed by the evaporator. In this process, a refrigerant of a wet gas state having a low temperature and pressure absorbs heat from air while changing into a refrigerant of an overheated steam state having a low temperature and pressure. A compression process is performed by the compressor. In this process, the refrigerant of a wet gas state having a low temperature and pressure is changed into a refrigerant of an overheated steam state having a high temperature and pressure so that external air of normal temperature and the refrigerant within the condenser are subject to a smooth thermal exchange.

A condensation process is performed by the condenser. In this process, the refrigerant of an overheated steam state having a high temperature and pressure is changed into a refrigerant of a liquid state having middle temperature and a high pressure so that a refrigerant of a gas state and the refrigerant of a liquid state can coexist. In an expansion process, the refrigerant of a liquid state having middle temperature and a high pressure is changed into a refrigerant of a wet gas state having a low temperature and pressure so that the refrigerant can be easily evaporated. Accordingly, the refrigerant is repeatedly changed from the liquid state, to the gas state, to the liquid state, thereby forming a cooling cycle.

The construction of the cooling and heating system is described in more detail below.

The ram air turbine 330 is used to obtain motive power necessary to drive the compressor 332 in a common cooling cycle.

The evaporator 333 functions to convert air, heated by a thermal load in the camera unit and the electronic unit 324, into cool air 338 cooled by a thermal exchange with the refrigerant circulated in the cooling cycle or hot air 338 heated by the heater 336. The evaporator 333 includes one heat exchanger, the fan 337 for ventilating air, the heater 336, and so on.

The condenser 339 functions to convert overheated steam, compressed by the compressor 332 in the cooling cycle, into saturated steam by cooling the overheated steam. The condenser 339 is a kind of a heat exchanger.

The expansion valve 334 functions to expand a refrigerant of a liquid state having a high temperature and pressure, transferred from the condenser 339, to a 2-phase flow refrigerant of a liquid state and a gas state having a low temperature and pressure by throttling the refrigerant of a liquid state and then sends the 2-phase flow refrigerant to the evaporator 333.

The heater 336 functions to raise internal temperature of the camera unit and the electronic unit 324 when the internal temperature of the camera unit and the electronic unit 324 is lower than a proper temperature. The fan 337 ventilates air, and the heater 336 supplies the hot air 338 to the camera unit and the electronic unit 324.

Although not shown, the cooling and heating system may include other constituent elements, such as a flow rate pump and a dry valve.

Temperature is chiefly controlled through the three kinds of loop and heating, including the cooling cycle flow loop 326, the condenser air flow loop 327, the heating system by the heater 336, and the air circulation loop 328.

In the condenser air flow loop 327, the introduced ram air 325 rotates the ram air turbine 330, and thus the ram air turbine 330 drives the compressor 332 coupled to the shaft of the ram air turbine. The ram air turbine 330 uses air introduced into the ram air scoop 329 when the aircraft flies and uses high-speed air obtained by operating the ground fan 335 on the ground.

The cooling cycle flow loop 326 includes the compressor 332, the evaporator 333, the expansion valve 334, and the condenser 339 which form a typical cooling cycle. The refrigerant circulates through a pipe line coupled to the constituent elements. A thermal exchange of the refrigerant in the cooling cycle with the air circulation loop 328 in the evaporator 333 functions to control temperature of the hot air 338 heated by a thermal load of the camera unit and the electronic unit 324 so that the hot air 338 becomes cool air. A thermal exchange in the condenser 339 may use the ram air 325 or ventilation air of the ground fan 335. Here, the speed of revolution of the ram air turbine 330 is differently controlled depending on cooling performance of a necessary cooling cycle. The speed of revolution of the ram air turbine 330 is adjusted by an angle of the louver 331 which is placed between the ram air scoop 329 to which external air is inputted and the ground fan 335.

In the air circulation loop 328, the fan 337 lowers or raises the internal temperature of the camera unit and the electronic unit 324 by ventilating and circulating the cooling air of the evaporator 333 or the heating air of the heater 336 to and through the camera unit and the electronic unit 324 so that the internal temperature of the camera unit and the electronic unit 324 maintains a proper temperature.

The condenser air flow loop 326 is described in more detail. Air first entered via the ram air scoop 329 is theoretically compressed in an isoentropic process, and it reaches the front of the ram air turbine 330. The air according to a complete isoentropic process, however does not reach the ram air turbine 330 owing to flow friction between the ram air scoop 329 and the air. Furthermore, as a task is performed in the ram air turbine 330, the temperature and pressure of the air are lowered. The air may be theoretically subject to the isoentropic process, but the air subject to an irreversible process in which entropy is increased reaches the condenser 339. At this time, the air introduced into the condenser 339 is slightly heated and externally discharged through an air outlet. In this case, temperature of the air is theoretically lowered through the isoentropic process and discharged along with air, but the air is subject to a thermodynamic cycle according to the irreversible process. Accordingly, a main object of the condenser air flow loop 326 is to drive the compressor 332 of the cooling cycle flow loop 327 coupled to the ram air turbine 330 of the cooling cycle flow loop 327.

The louver 331 is used to properly adjust the speed of the ram air turbine 330 by controlling the amount of air flow. The louver 331 is driven by an electric motor, and it functions to prevent the overspeeding of the ram air turbine 330 by limiting the speed of revolution of the ram air turbine 330. Sensors are mounted on the louver, and they provide angle and position information to a controller. The louver 331 uses air introduced via the ram air scoop 329 when it is mounted on aircraft and operated and utilizes high-speed air by driving the ground fan 335 in a ground operation condition.

Typically, in order to maximize the cooling efficiency of the cooling cycle flow loop 327, the number of rotations of the compressor, the degree of opening of the electronic expansion valve, and the number of rotations of the fan of each of the evaporator and the condenser need to be controlled. From among them, a method of controlling the capacity of the compressor by varying the number of rotations of the compressor or a method of controlling the degree of superheat of the evaporator by controlling the degree of opening of the electronic expansion valve is used. Furthermore, control for preventing the overheating of the compressor, control of evaporation temperature, control of the flow rate of the refrigerant according to a thermal load of the evaporator, etc. may be performed.

The compressor typically includes a reciprocating compressor, a rotary compressor, a scroll compressor, a screw compressor, and a centrifugal compressor. The operating state of the compressor chiefly depends on condensation temperature, evaporation temperature, and the degree of superheat of a suction gas. The performance of the compressor is determined by three kinds of performance values; volume efficiency, compression efficiency, and machine efficiency. In most compressors, the cooling capacity is set to be greater than a capacity at the time of a standard operation. Accordingly, when the compressor is actually operated, the cooling capacity of the compressor must be controlled. In the compressor, technology for varying the cooling capacity includes control of the speed of revolution, control of a suction volume, loading control, and so on. A method of controlling the cooling capacity includes a method of controlling the cooling capacity by mechanically loading and unloading a fixing scroll and a revolution scroll through control of a solenoid valve according to a pulse width modulation scheme externally, a method of controlling the cooling capacity so that the cooling ability of the compressor is changed in multiple stages based on the opening and shutting of a bypass flow path by constructing a bypass refrigerant valve between upper and lower cylinders, a method of controlling the cooling capacity by varying the speed of revolution of the compressor using an inverter, etc.

From among the control elements of the steam cycle cooling system, control of the degree of superheat of the evaporator has a great effect on the efficiency and stability of the cooling system. That is, when the capacities of the compressor and the evaporator are controlled, the entire system becomes unstable and the compressor may be damaged because the degree of superheat of the evaporator abruptly changes according to a change of the capacities. A capillary tube and a thermostatic expansion valve for controlling the degree of superheat of the evaporator outlet are used.

In the conventional technology, however, the air cycle cooling apparatus of FIG. 5 is inappropriate for an image information acquisition apparatus mounted outside aircraft in the form of a pod. This is because it is difficult for the image information acquisition apparatus mounted outside the aircraft to receive the bleed air 120 from the compressor of the main engine 110 of the aircraft.

The air cycle cooling apparatus of FIG. 6 may have a small size and light weight, but has disadvantages in that it is operated only during flying and it must include an additional cooling air supply apparatus on the ground.

The environmental control apparatus of FIG. 7 in which the air cycle cooling apparatus and the steam cycle cooling apparatus are mixed enables cooling and heating without limitations on the ground or during flying, but is disadvantageous in that a cooling load cannot be rapidly handled, it is difficult to control temperature, and the environmental control apparatus may not be applied to a system having a limited weight because it is too bulky and heavy.

In the conventional compressor, a reciprocating compressor has heavy weight and great vibration and has a problem in low efficiency.

In a capillary tube method initially applied to the expansion valve for controlling the cooling capacity in the conventional cooling cycle, since the section of a flow path is fixed, a change of a cooling load is determined by a state of the degree of supercooling of a refrigerant at the condenser outlet according to a change of the number of rotations of the compressor.

In the refrigerant circulation method, it is difficult to rapidly control the degree of superheat of the evaporator within a necessary range. A Thermostatic Expansion Valve TXV includes a sensing bulb configured to have a refrigerant gas sealed therein and attached to the pipe on the outlet side of the evaporator. The refrigerant gas of the sensing bulb is expanded or contracted by the saturation pressure of the refrigerant within the evaporator and a temperature difference of an exit refrigerant, so that diaphragm coupled to a poppet valve controls the degree of opening of the valve for temperature controlling.

A difference between the steam temperature of a refrigerant and the saturation temperature of the refrigerant is called the degree of superheat. This value can be detected by measuring a difference between an actual temperature of the sensing bulb and a saturation temperature corresponding to the suction pressure of the refrigerant which flows within a pipe line at a position where the sensing bulb is placed. The Thermostatic Expansion Valve TXV functions to prevent the refrigerant from returning back to the compressor, to make almost the entire surface of the evaporator effectively utilized, to make the amount of flow of the refrigerant identical with the amount of the refrigerant that may be evaporated in the evaporator, and to maintain the degree of superheat of the refrigerant within a set range although a thermal load of the evaporator is changed, by controlling the degree of superheat.

However, the pressure of the refrigerant sealed in the sensing bulb may have a detection error owing to a disturbance due to a change of peripheral temperature, and a limit to the deformation of the diaphragm may lead to a delayed forced transfer of the refrigerant when quick cooling is required. Imbalance in the flow control of the refrigerant having a transient state results in a phenomenon in which the refrigerant gas is periodically generated within the evaporator, thus having an adverse effect on the stability of the system. Furthermore, it is difficult to rapidly control the flow against the driving of the inverter of the compressor and a change of a thermal load of the evaporator, and efficient control of the cooling system is difficult.

The conventional cooling system has a very great change in the amount of the refrigerant which is circulated within the cycle because it is operated within a wide temperature range. Accordingly, the conventional cooling system includes an additional liquid receiver for storing an excessive refrigerant according to an operating condition. The additional liquid receiver temporarily stores a refrigerant solution condensed by the condenser and transfers only the amount of the refrigerant, corresponding to an amount consumed within the evaporator, to the expansion valve.

The conventional heating technology is disadvantageous in that the construction is complicated, the heater (i.e., a heating component) is bulky, and an installation space is large because the heating apparatus different from the environmental control apparatus and the control apparatus for controlling the heating apparatus are installed in the camera unit or the electronic unit.

SUMMARY OF THE INVENTION

Accordingly, the present invention has been made in view of the above problems occurring in the prior art, and it is an object of the present invention to provide a small-size and light-weight environmental control apparatus for aircraft-external stores which is capable of properly maintaining temperature of the camera unit and the electronic unit of a high-resolution image information acquisition apparatus in an operating environment, such as high-speed movement or an abrupt change of an altitude in a high resolution image information acquisition process.

In particular, an object of the present invention is to provide a small-size and light-weight environmental control apparatus for aircraft-external stores, which can properly maintain temperature of the camera unit or the electronic unit more efficiently and which can be installed in a narrow space by simplifying the construction of the environmental control apparatus.

Another object of the present invention is to provide a small-size and light-weight environmental control apparatus for aircraft-external stores, which can control heating using a single controller by mounting a small size and light-weight heater as compared with a heating capacity, perform cooling and heating without using an additional liquid receiver by controlling a capacity and the degree of superheat through an electronic expansion valve using a variable speed compressor, and maintain temperature of the camera unit and the electronic unit within a specific temperature range by optimally controlling a cooling cycle and controlling a heating apparatus using the controller.

To achieve the above objects, a small-size and light-weight environmental control apparatus for aircraft-external stores according to the present invention supplies a constant temperature environment to an image information acquisition apparatus provided in a pod of aircraft and includes (A) a condensation air flow loop in which a ground fan driven when the aircraft is moved on the ground or a ram air scoop driven when the aircraft flies performs a thermal exchange with a condenser forming a cooling/heating flow loop; (B) the cooling/heating flow loop, including an evaporator configured to absorb surrounding evaporation heat by evaporating the refrigerant, a compressor configured to have a rotating shaft coupled to the shaft of a ram air turbine, a condenser configured to perform a thermal exchange by the condensation air flow loop, and an expansion valve configured to expand the refrigerant condensed by the condenser, wherein the evaporator, the compressor, the condenser, and the expansion valve are interconnected by a refrigerant circulation line; (C) an air circulation loop for circulating and supplying cooled or heated air to a camera/electronic unit so that the camera/electronic unit maintains a constant temperature; and (D) a controller for controlling the driving of the constituent elements in each of the loops.

It is preferred that the compressor be a variable type rotary compressor capable of varying the number of rotations and the expansion valve be an electronic expansion valve so that the degree of superheat of the evaporator can be rapidly controlled because the environmental control apparatus according to the present invention preferably has a small size and light weight if possible.

Furthermore, it is preferred that an accumulator be further provided between the evaporator and the compressor in order to prevent damage to the compressor due to an abrupt introduction of the refrigerant and refrigerator oil and one or more pumps be included in the refrigerant circulation line so that the refrigerant can be smoothly circulated.

BRIEF DESCRIPTION OF THE DRAWINGS

Further objects and advantages of the invention can be more fully understood from the following detailed description taken in conjunction with the accompanying drawings in which.

Figure 1:
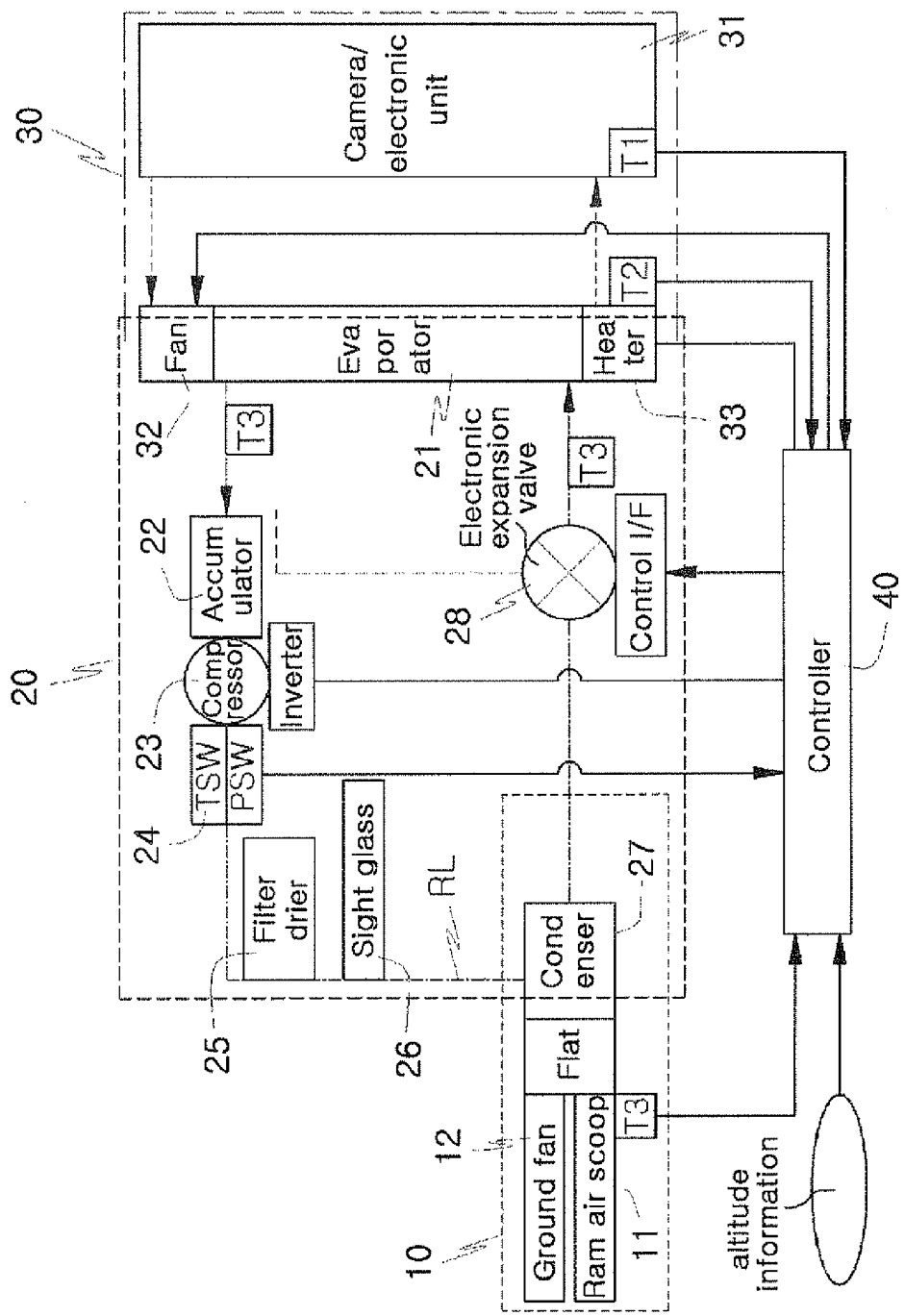
FIG. 1 is a schematic block diagram illustrating an environmental control apparatus and a temperature control method according to an embodiment of the present invention.

| <Description of reference numerals of principal elements in the drawings> | |
|---|---|
| 1: aircraft | 2: image information acquisition apparatus |
| 3: environmental control apparatus | 4: electronic unit |
| 10: condensation air flow loop | 11: ram air scoop |
| 12: ground fan | 20: cooling/heating flow loop |
| 21: evaporator | 22: accumulator |
| 23: compressor | 27: condenser |
| 25: filter drier | 28: electronic expansion valve |
| 26: sight glass | 30: air circulation loop |
| 31: camera/electronic unit | 40: controller |

DETAILED DESCRIPTION OF EMBODIMENTS

Some exemplary embodiments of the present invention will now be described in detail with reference to the accompanying drawings.

However, the accompanied drawings are only illustrative in order to easily describe the contents and range of the technical spirit of the present invention, and the technical scope of the present invention is not limited by the drawings. Furthermore, various modifications and changes of the present invention within a range of the technical spirit of the present invention based on the illustrations will be evident to those skilled in the art.

A small-size and light-weight environmental control apparatus for aircraft-external stores according to the present invention, which can properly maintain temperature of a camera unit or an electronic unit more efficiently and which can be installed in a narrow space by simplifying the construction of the environmental control apparatus. The environmental control apparatus chiefly includes a condensation air flow loop 10, a cooling/heating flow loop 20, an air circulation loop 30, and a controller 40.

Figure 2:
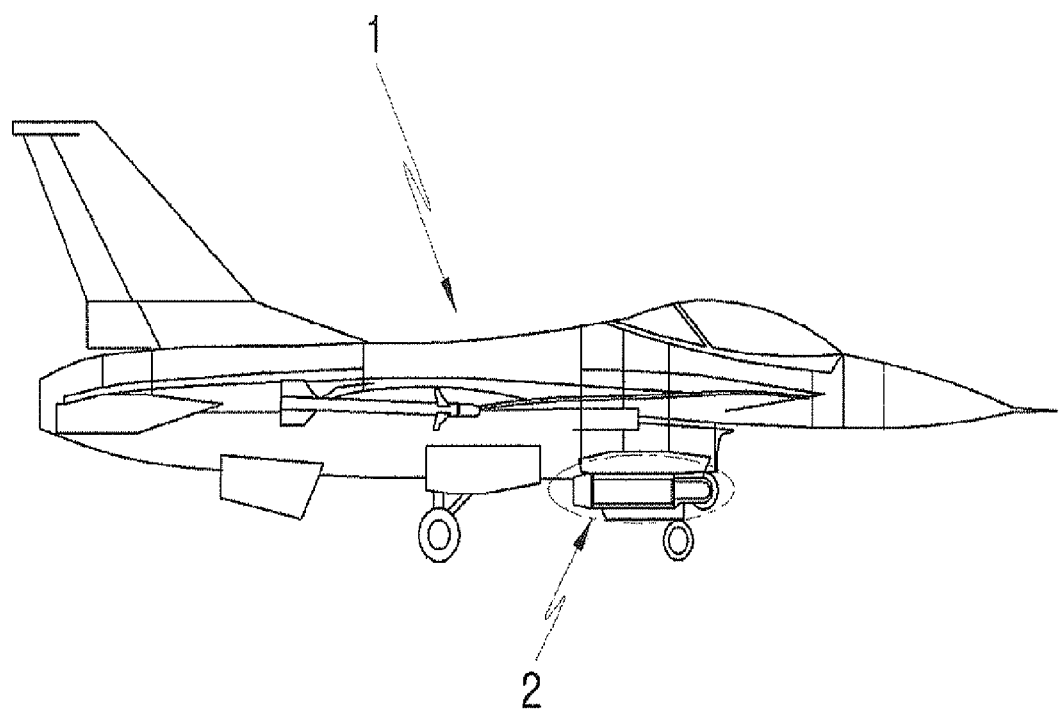
FIG. 2 is a lateral view of an aircraft on which a high-resolution image information acquisition apparatus is mounted.
Figure 3:
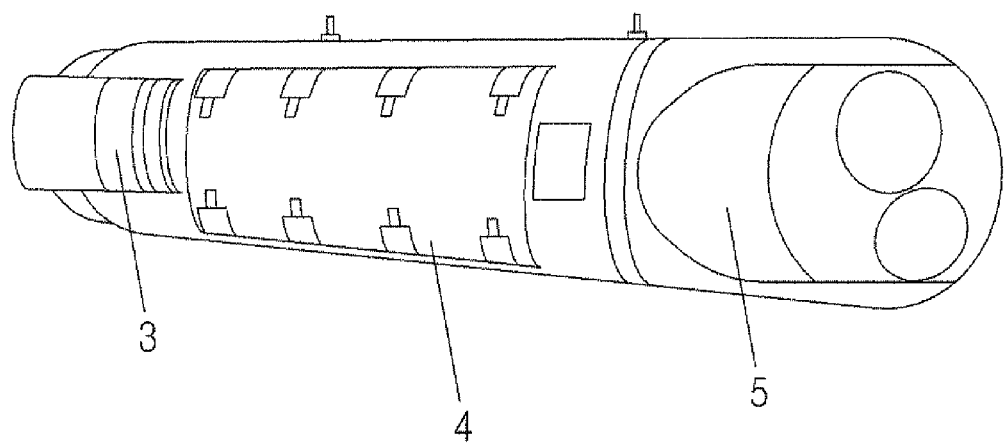
FIG. 3 is a diagram showing that the environmental control apparatus is combined with the high-resolution image information acquisition apparatus according to the present invention.
Figure 4:
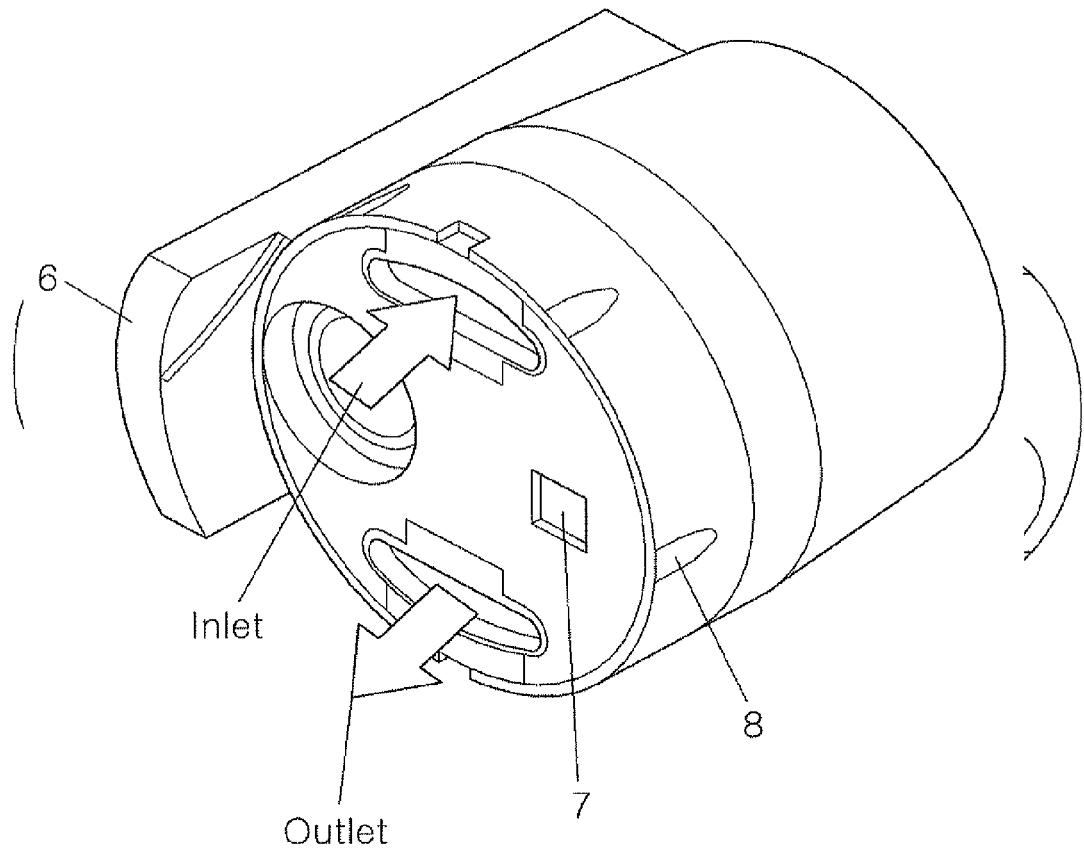
FIG. 4 shows an outward appearance of the environmental control apparatus according to the present invention.
Figure 5:
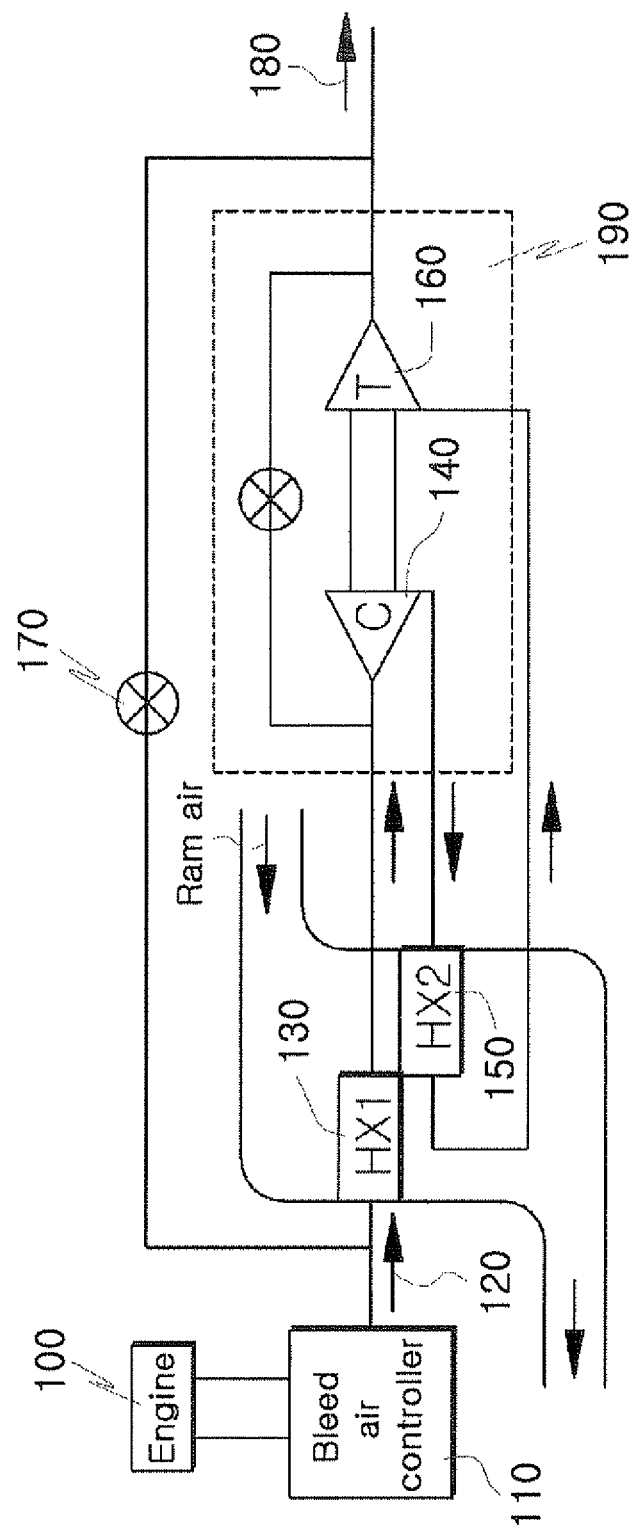
FIG. 5 is a schematic diagram of a conventional air cycle cooling apparatus.
Figure 6:
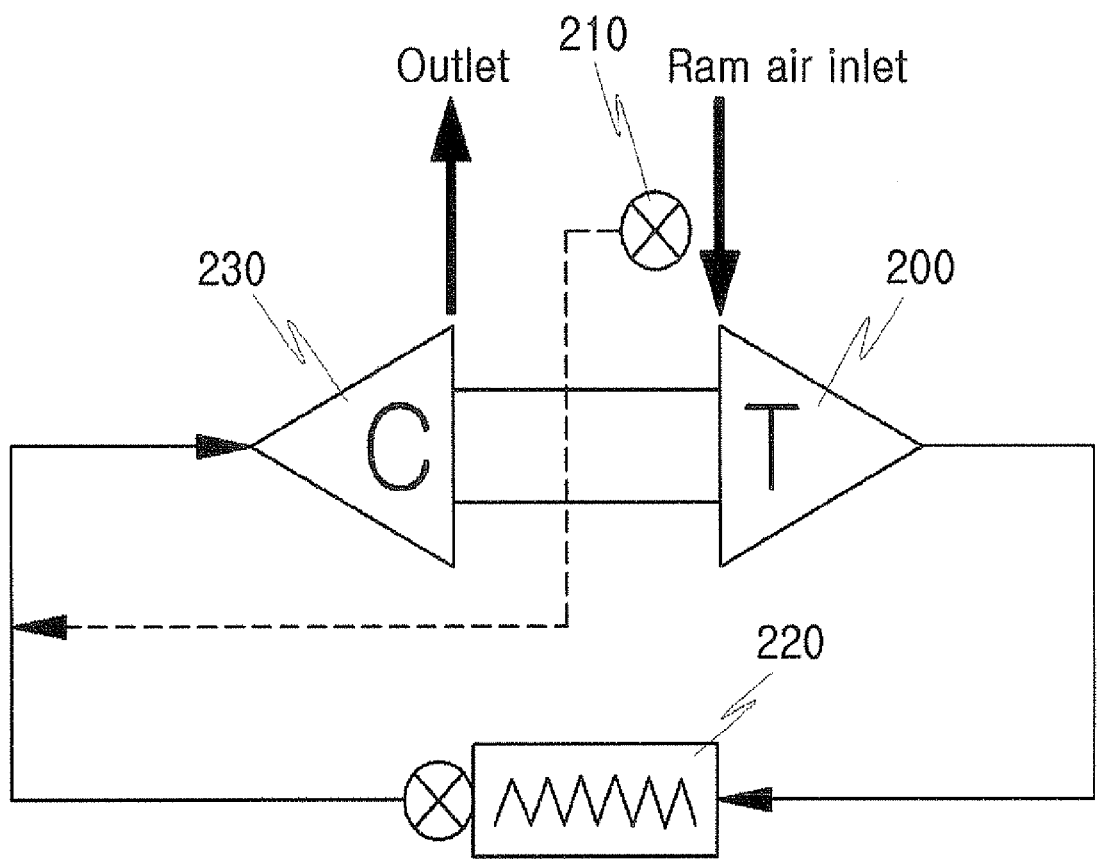
FIG. 6 shows a conventional reverse Brayton air cycle cooling apparatus.
Figure 7:
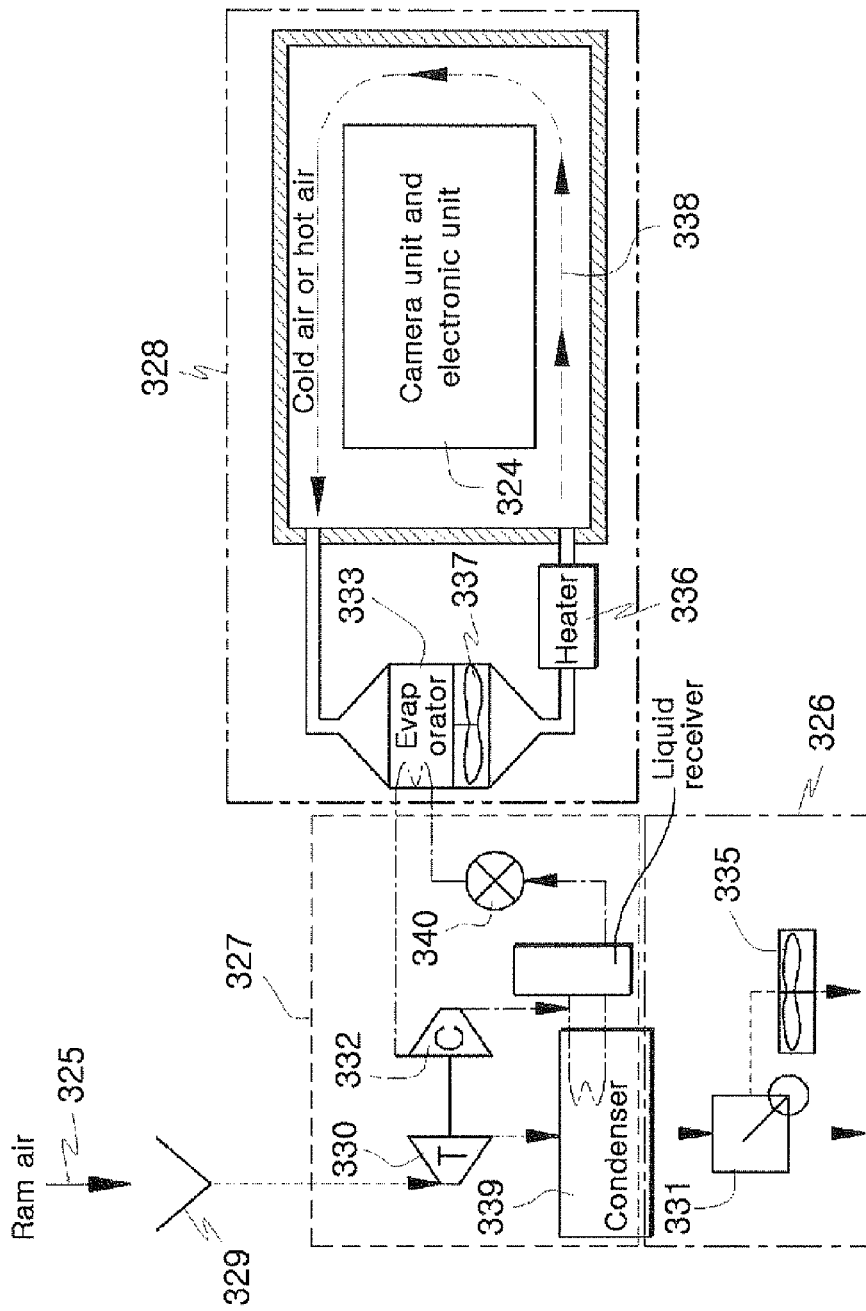
FIG. 7 shows a conventional cooling/heating apparatus in which an air cycle and a steam cycle are combined.

The environmental control apparatus for a high-resolution image information acquisition apparatus mounted on aircraft according to the present invention is installed in the pod of the aircraft as shown in FIG. 2 and installed in the high resolution image information acquisition apparatus constructed as shown in FIG. 3. The environmental control apparatus has an outward appearance, such as that shown in FIG. 4, and it has a construction, such as that shown in FIG. 7.

The condensation air flow loop 10 is means for absorbing the heat of a condenser 27 through a thermal exchange with the condenser 24 or for transferring the heat to the condenser 27. Here, a method of performing a thermal exchange is varied according to the operating state of aircraft.

That is, when the aircraft is moved on the ground, the condensation air flow loop 10 includes a ground fan 12 as means for supplying air for a thermal exchange and a ram air scoop 11 for supplying air for flying.

The condenser 27 in which a thermal exchange is performed by the condensation air flow loop 10 is one constituent element forming the cooling/heating flow loop 20. The cooling/heating flow loop 20 includes an evaporator 21 configured to absorb surrounding evaporation heat by evaporating the refrigerant, a compressor 23 configured to have a rotating shaft coupled to the shaft of a ram air turbine, the condenser 27, and an electronic expansion valve 28 configured to expand the refrigerant condensed by the condenser 27. The evaporator 21, the compressor 23, the condenser 27, and the electronic expansion valve 28 are interconnected by a refrigerant circulation line RL.

The cooling/heating flow loop 20 has a similar construction to that of a common cooling/heating system, and an operation thereof will be described in detail later.

The refrigerant cooled or heated in the cooling/heating flow loop 20 is supplied to the air circulation loop 30 in order to cool or heat a camera/electronic unit 31 so that the camera/electronic unit 31 can maintain a constant temperature.

The cooling/heating flow loop 20 is operated in a cooling cycle or a heating cycle according to external temperature according to circumstances.

In the cooling cycle, the cooling/heating flow loop 20 is a cooling loop in which the refrigerant is circulated while forming a cycle in a pipe line so that the evaporator 21 can cool air from the air circulation loop 30 in order to cool hot air heated by generation of heat in the camera/electronic unit 31. Here, the cooling/heating flow loop 20 is performed through a typical cooling cycle.

That is, the refrigerant compressed in a gas state by the compressor 23 operated by the condenser air flow loop 10 is compressed in a overheated steam state. The refrigerant is subject to a thermal exchange in the condenser 27 driven by the ram air scoop 11, thus discharging heat. Next, the refrigerant is rapidly cooled by the electronic expansion valve 28. Next, the evaporator 21 performs a thermal exchange between the refrigerant and air necessary for the air circulation loop 30.

Each of the evaporator 21 and the condenser 27 is one heat exchanger, and it has a very dense pin structure having 30 cooling pins per inch. The evaporator 21 and the condenser 27 are used for the evaporation and condensation of air. The heat exchanger of the evaporator 21 is used for air in order to evaporate the refrigerant. The heat exchanger of the condenser 27 uses air introduced into the ram air scoop 11 in order to condense and cool the refrigerant.

The fan 32 of the evaporator 21 is a unit for smoothly supplying air to the camera/electronic unit 31 and is driven by a motor. The fan 32 has two speed modes and typically rotates at 11,500 rpm at an altitude of 30,000 feet from a sea level. A fan used in the mounting camera can transfer air at a flow rate of 70 liters/second at a low altitude or a flow rate of 120 liters/second at a high altitude.

The ground fan 12 functions to supply air to a ram turbine on the ground. The ground fan 12 rotates at about 6,000 rpm when the ground fan 12 is operated on the ground and functions to absorb heat from the condenser 27 and discharge the heat.

The environmental control apparatus includes the controller 40 as means for controlling the driving of the constituent elements forming the present invention.

The controller 40 controls a temperature controller and includes hardware and software necessary for an interface for communication with a signal processing module. A signal supplied from a system controller (not shown) to the controller includes a signal for determining whether aircraft is taking off/landing or flying. The controller 40 supplies a Mach (i.e., the speed of aircraft), an aircraft altitude, external flow air temperature, and temperature of the camera/electronic unit.

Furthermore, the controller 40 receives the pressure and temperature of the compressor 23, the pressure and temperature of the evaporator 21, an angle of a louver, and the speed of the ram turbine in a cooling cycle and a condenser air flow loop and generates command signals for driving a dry pump, a flow control pump, a louver, the evaporator 21, the ground fan 10, and a heater 33. The command signals are sent to a control I/F.

An object of the present invention is to achieve a smaller-size and light-weight environmental control apparatus. The compressor 23 adopts a variable type rotary compressor which is suitable for a small size and light weight and which can vary the number of rotations. The electronic expansion valve 28 is used as an expansion valve capable of rapidly controlling the degree of superheat of the evaporator 21.

Furthermore, in order to prevent the compressor 23 from being damaged owing to an abrupt introduction of a refrigerant and refrigerator oil, an accumulator 22 is further provided between the evaporator 21 and the compressor 23. The accumulator 22 is a temporary storage tank for a liquid refrigerant and oil mixture and is designed to suck the mixture to the compressor 23 at a proper ratio.

It is preferred that the accumulator 22 have pipe laying in a vertical direction and the accumulator 22 be installed almost at the same height as the compressor 23.

Furthermore, one or more pumps are included in the refrigerant circulation line RL in order to make smooth and control the flow of the refrigerant. It is preferred that a filter drier 25 for protects the system by filtering moisture, acid materials, and alien substances and a sight glass 26 for determining whether the flow of the refrigerant flowing through the refrigerant circulation line RL is normal be provided between the compressor 23 and the condenser 27.

The environmental control apparatus of the present invention may further include the heater 33 for heating air when the air is circulated through the air circulation loop 30 and the fan 32 for discharging the air, passing through the camera/electronic unit 31, outside the air circulation loop 30, as shown in FIG. 1.

It is preferred that the environmental control apparatus according to the present invention further include the plurality of pumps. The pumps may include a flow rate control pump (not shown) for controlling the amount of the refrigerant necessary for thermodynamics by supplying the refrigerant from the accumulator 22 to the evaporator 21, a dry pump (not shown) for transferring the refrigerant of the evaporator 21 to the accumulator 22 in a state in which the electronic expansion valve 28 is opened, and so on.

When the dry pump is operated, the compression ratio of the refrigerant is increased. Consequently, an evaporation temperature is lowered, temperature of the refrigerant rises at the outlet of the compressor 23, and thus the speed of the ram turbine is further increased.

When the flow rate control pump is operated, the compression ratio of the refrigerant is decreased. Consequently, an evaporation temperature rises, temperature of the refrigerant is lowered at the outlet of the compressor 23, and thus the speed of the ram turbine is decreased. The heater is placed at the rear of the evaporator 21 and operated when temperature of the camera/electronic unit 31 is low.

Although not shown, a power module for supplying electric power to the elements may be further included. The power module functions to supply electric power to a driving unit requiring electrical energy and to supply necessary electric power to the controller 40, the evaporator 21, the ground fan 12, the heater, etc.

The present invention relates to a steam cycle system which is electrically driven and cooled using recovery air of which temperature is 70 degrees celsius and supply air of which temperature is 30 degrees celsius by using R236fa (i.e., an eco-friendly refrigerant).

The apparatus is controlled by an FPGA digital controller and is operated in conjunction with a fault diagnosis function, an aircraft communication interface, and system control of the camera/electronic unit. An overheated steam refrigerant outputted from the outlet of the evaporator 21 is compressed by the compressor 23.

The high pressure and overheated steam outputted from the compressor 23 is subject to air cooling by the condenser 27. The steam is cooled by ram air during flying and is cooled by the ventilation of the ground fan 12 on the ground.

Whether the ground fan 12 is driven is determined based on a Weight-on-wheels signal generated from the aircraft on the ground. In most states, the refrigerant is cooled at a saturation temperature or lower within the condenser 27.

The refrigerant returned to the compressor 23 is repeatedly operated according to the same cycle.

The cooling air is ventilated and supplied to the camera/electronic unit 31 by means of the fan 32 driven at a 2-stage speed.

The fan 32 driven at the 2-stage speed is operated at a low speed at a low altitude and operated at a high speed in order to obtain a sufficient air flow rate at a high altitude where the density of air is low.

A power of 115 VAC/400 Hz supplied from the aircraft is supplied to the compressor 23, the ground fan 12, and the fan 32. A power of 28 VDC is supplied to the controller 40 and the sensors. The filter drier 25 functions to protect the system by filtering moisture, acid materials, and alien substances.

As described above, the present invention can provide the environmental control apparatus for the small-size and light-weight image information acquisition apparatus, which can perform a cooling and heating function during flying or in a ground operating environment.

In particular, according to the present invention, the controller receives pieces of information, such as temperature, a flying speed, and an altitude, and controls the heater, the fan, the electronic expansion valve, a flat, and a compressor inverter based on the pieces of information. Accordingly, cold air or hot air is supplied so that the camera/electronic unit can maintain a proper temperature. Consequently, the image information acquisition apparatus can operate under an optimal condition and obtain accurate information.

Furthermore, a small size and light weight are possible because the compressor is formed of the small-size and light-weight variable type rotary compressor. The degree of superheat of the evaporator can be rapidly controlled by using the electronic expansion valve.

Furthermore, there is an advantage in that cooling/heating control can be performed by using the single controller within the environmental control apparatus because a small size and light weight are possible as described above.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A small-size and light-weight environmental control apparatus for aircraft-external stores, the environmental control apparatus supplying a constant temperature environment to an image information acquisition apparatus provided in a pod of an aircraft and comprising:
   (A) a condensation air flow loop in which a ground fan driven when the aircraft is moved on a ground and a ram air scoop driven when the aircraft flies perform a thermal exchange with a condenser forming a cooling/heating flow loop;
   (B) the cooling/heating flow loop including an evaporator configured to absorb surrounding evaporation heat by evaporating the refrigerant, a compressor configured to have a rotating shaft coupled to a shaft of a ram air turbine, a condenser configured to perform a thermal exchange by the condensation air flow loop, an expansion valve configured to expand the refrigerant condensed by the condenser, and a heater, wherein the evaporator, the compressor, the condenser, and the expansion valve are interconnected by a refrigerant circulation line;
   (C) an air circulation loop for circulating and supplying cooled or heated air by the cooling/heating flow loop to a camera/electronic unit so that the camera/electronic unit maintains a constant temperature; and
   (D) a controller for controlling a driving of the constituent elements in each of the loops,
   wherein the environmental control apparatus does not include a liquid receiver.

2. The environmental control apparatus as claimed in claim 1, wherein the compressor is a variable type rotary compressor capable of varying a number of rotations.

3. The environmental control apparatus as claimed in claim 1, wherein the expansion valve is an electronic expansion valve.

4. The environmental control apparatus as claimed in claim 2, wherein the expansion valve is an electronic expansion valve.

5. The environmental control apparatus as claimed in claim 3, wherein an accumulator is further provided between the evaporator and the compressor.

6. The environmental control apparatus as claimed in claim 4, wherein an accumulator is further provided between the evaporator and the compressor.

7. The environmental control apparatus as claimed in claim 5, wherein one or more pumps are further included in the refrigerant circulation line.

8. The environmental control apparatus as claimed in claim 6, wherein one or more pumps are further included in the refrigerant circulation line.

9. The environmental control apparatus as claimed in claim 7, wherein a filter drier for protecting a system by filtering moisture, acid materials, and alien substances and a sight glass for determining whether the flow of the refrigerant flowing through the refrigerant circulation line is normal are provided between the compressor and the condenser.

10. The environmental control apparatus as claimed in claim 8, wherein a filter drier for protecting a system by filtering moisture, acid materials, and alien substances and a sight glass for determining whether the flow of the refrigerant flowing through the refrigerant circulation line is normal are provided between the compressor and the condenser.

* * * * *